United States Patent
Merrill, Jr. et al.

(10) Patent No.: US 9,758,374 B2
(45) Date of Patent: *Sep. 12, 2017

(54) CENTRIFUGE MEMS STICTION DETECTION AND SCREENING SYSTEM AND METHOD

(71) Applicant: mCube Inc., San Jose, CA (US)

(72) Inventors: Raymond Merrill, Jr., San Ramon, CA (US); Dave Paul Jensen, Saratoga, CA (US); Yuan-Chun Liu, San Jose, CA (US)

(73) Assignee: mCube Inc., San Jose, CA (US)

( * ) Notice: Subject to any disclaimer, the term of this patent is extended or adjusted under 35 U.S.C. 154(b) by 499 days.

This patent is subject to a terminal disclaimer.

(21) Appl. No.: 14/267,864

(22) Filed: May 1, 2014

(65) Prior Publication Data

US 2015/0284245 A1 Oct. 8, 2015

Related U.S. Application Data

(60) Provisional application No. 61/820,123, filed on May 6, 2013.

(51) Int. Cl.
*B81C 99/00* (2010.01)

(52) U.S. Cl.
CPC .......... *B81C 99/004* (2013.01); *B81C 99/005* (2013.01); *B81C 99/0035* (2013.01)

(58) Field of Classification Search
CPC .. G01N 19/02; B81C 99/005; B81C 99/0035; B81C 99/004; G01P 13/00
See application file for complete search history.

(56) References Cited

U.S. PATENT DOCUMENTS

| | | | | |
|---|---|---|---|---|
| 5,389,182 | A * | 2/1995 | Mignardi | B81C 1/00896 156/701 |
| 6,445,203 | B1 * | 9/2002 | Yamashita | G01R 31/2856 324/750.08 |
| 2009/0095095 | A1 * | 4/2009 | Hayashi | B81C 99/005 73/865.8 |
| 2011/0156734 | A1 * | 6/2011 | Berry | G01R 31/2891 324/750.19 |
| 2011/0260734 | A1 * | 10/2011 | Liao | B81C 99/005 324/537 |
| 2012/0304926 | A1 * | 12/2012 | Boguslavskiy | H01L 21/67109 118/696 |

* cited by examiner

*Primary Examiner* — Hezron E Williams
*Assistant Examiner* — Marrit Eyassu
(74) *Attorney, Agent, or Firm* — Kilpatrick Townsend and Stockton LLP

(57) ABSTRACT

A centrifuge screening system and method of testing MEMS devices using the system. The wafer level centrifuge screening system can include a base centrifuge system and a cassette mounting hub coupled to the base centrifuge system. The method can include applying a smooth and continuous acceleration profile to one or more MEMS components via the base centrifuge system. Each of the one or more MEMS components can have one or more MEMS devices formed thereon. The one or more MEMS components can be provided in one or more cassettes configured on the cassette mounting hub. The method can also include identifying one or more target MEMS components, which can include identifying stiction in one or more MEMS devices on the one or more MEMS components.

18 Claims, 5 Drawing Sheets

CENTRIFUGE MEMS STICTION DETECTION AND SCREENING SYSTEM AND METHOD

CROSS-REFERENCES TO RELATED APPLICATIONS

The present application claims priority to and incorporates by reference, for all purposes, the following patent application: 61/820,123, filed May 6, 2013.

BACKGROUND OF THE INVENTION

The present invention is directed to MEMS (Micro-Electro-Mechanical-Systems). More specifically, embodiments of the invention provide methods and systems for testing MEMS devices and components, including inertial sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving the manufacture of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods and systems for testing MEMS devices and components. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Embodiments of the present invention can include a wafer level centrifuge (WLC) system and method of testing MEMS devices using the system. The wafer level centrifuge (WLC) system can include a base centrifuge system and a cassette mounting hub coupled to the base centrifuge system. The method can include applying a static and/or smooth and continuous acceleration profile to two or more MEMS wafers via the base centrifuge system. The acceleration profile can includes a smooth acceleration profile, a static acceleration profile, a continuous acceleration profile, a step-wise acceleration profile, or a pulsed acceleration profile, or the like. Each of the two or more MEMS wafers can have one or more MEMS devices formed thereon. The two or more MEMS wafers can be provided in two or more wafer holding cassettes configured on the cassette mounting hub. The method can also include identifying one or more target MEMS wafers, which can include identifying stiction in one or more MEMS devices on the one or more MEMS wafers.

Other embodiments of the present invention include a tray level centrifuge (TLC) system and method of testing MEMS devices using the system. The tray level centrifuge (TLC) system can also include a base centrifuge system and a cassette mounting hub coupled to the base centrifuge system. The method can include applying a controlled acceleration profile to two or more MEMS components via the base centrifuge system. The controlled acceleration profile can includes a smooth acceleration profile, a static acceleration profile, a continuous acceleration profile, a step-wise acceleration profile, or a pulsed acceleration profile, or the like. These components can include trays of diced, packaged, or processed parts and the like, which are configured in tray cassettes or tray carriers and the like. These tray cassettes or carriers can be configured on the cassette mounting hub. The method can also include identifying one or more target MEMS components or parts, which can include identifying stiction in one or more of these MEMS diced or processed parts.

The Wafer Level Centrifuge (WLC) and the Tray Level Centrifuge (TLC) both provide a continuous, non-destructive way to expose all of the MEMS devices on a silicon wafer or packaged parts in trays to g-forces high enough to cause contact between moving parts. If any given die on the wafer remains stuck after the g-force is removed, the die can then be detected by chip probe and removed from the product population. Similarly, if any given packaged MEMS part provided in the tray cassettes or carriers remains stuck after the g-force is removed, then these parts can be detected by chip probe and also removed from the product population.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide methods and systems for testing MEMS devices and components. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Embodiments of the present invention provide a system and a method for stimulating MEMS contact in a controlled way so as to detect and possibly screen MEMS devices in wafer form for stiction. This method can be applied to MEMS devices in any phase of development, from the wafer to a fully encapsulated device.

In many MEMS devices, silicon structures are either designed to move, or move as a secondary effect, as the result of a given acceleration, and come into contact with another surface as the end of travel is reached. The problem is that typical methods of stimulating a MEMS device to reach the point of contact involve shocking devices mechanically. These methods would not be possible in wafer form, nor would these methods be very repeatable given the complex dynamics of shock testing.

The Wafer Level Centrifuge (WLC) and the Tray Level Centrifuge (TLC) both provide a continuous, non-destructive way to expose all of the MEMS devices on a silicon wafer or packaged parts in trays to g-forces high enough to cause contact between moving parts. If any given die on the wafer remains stuck after the g-force is removed, the die can then be detected by chip probe and removed from the product population. Similarly, if any given packaged MEMS part provided in the tray cassettes or carriers remains stuck after the g-force is removed, then these parts can be detected by chip probe and also removed from the product population.

The alternative is packaged part shock testing or centrifuge, which is far more costly and time consuming.

Figure 1:
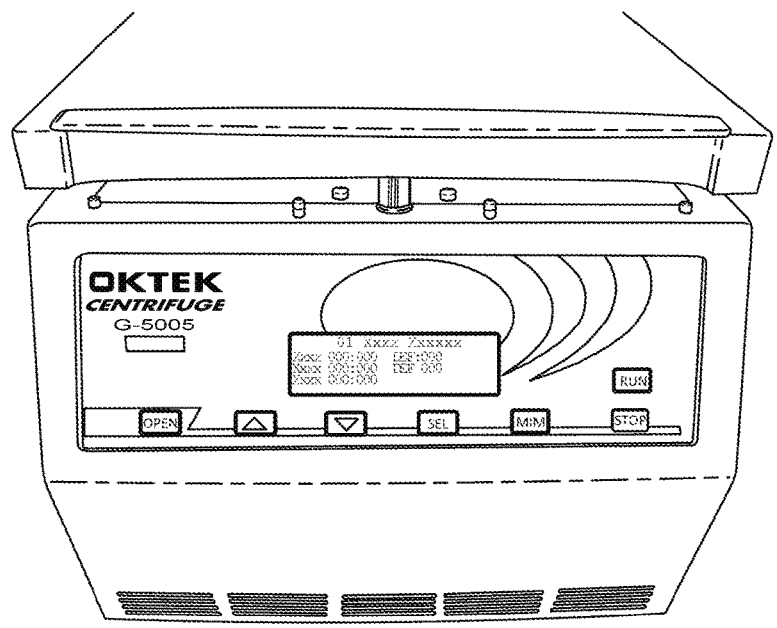
FIG. 1 is a picture of a conventional centrifuge.

FIG. 1 is a picture of a conventional centrifuge. This centrifuge is an OKTEK model G-5005. Embodiments of the present invention can include such a centrifuge with custom hardware designed to provide a unique platform for exposing up to four 8" wafers to a rotational centrifugal force (RCF). Other off-the-shelf centrifuge models and the like can be used in the WLC systems as described herein. These WLC systems can be designed for ease of use and safety. For example, retrofitting an existing centrifuge can be time-efficient and may only require a Phillips head screwdriver.

Figure 2:
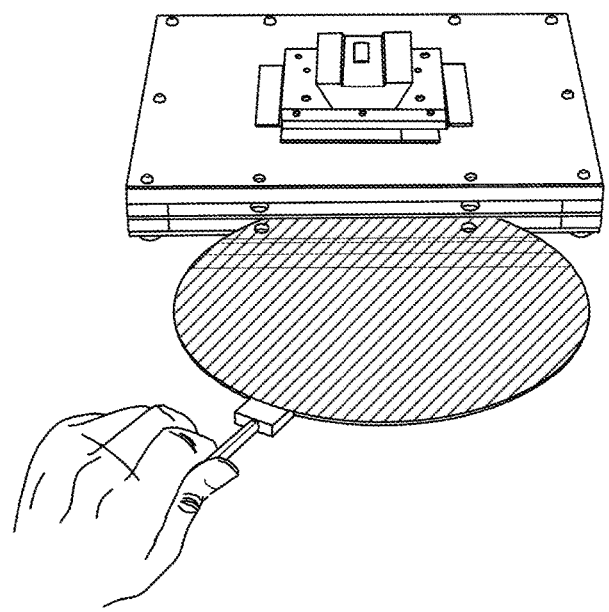
FIG. 2 is a picture of a conventional wafer holding cassette with a wafer.

FIG. 2 is a picture of a conventional wafer holding cassette with a wafer. This wafer holding cassette is a 2-slot titanium wafer cassette with Delrin ribs for wafer edge protection. These wafer holding cassettes can be used in one or more embodiments of the WLC system.

Figure 3:
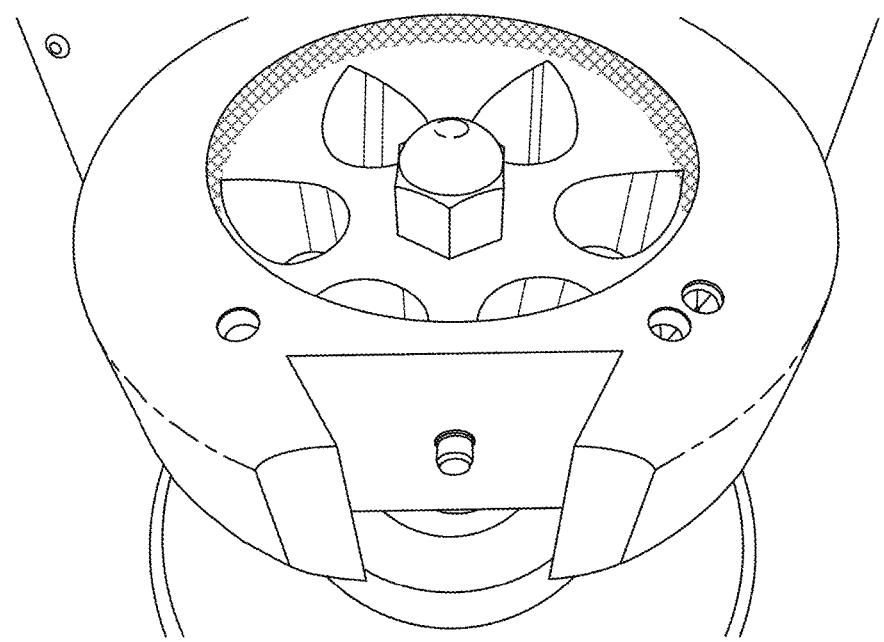
FIG. 3 is a picture of a conventional dovetail central hub.

FIG. 3 is a picture of a conventional dovetail central hub. This central hub can be a pinned dovetail central hub, which can be used in one or more embodiments of the WLC system. These kinds of dovetail central hubs can provide quick cassette insertion and removal, which allows ease of operation and minimal risk of operator installation error. Other similar mechanisms that releasably secure the cassettes to the drive hub can be used in place of the dovetail hub as well.

Figure 4:
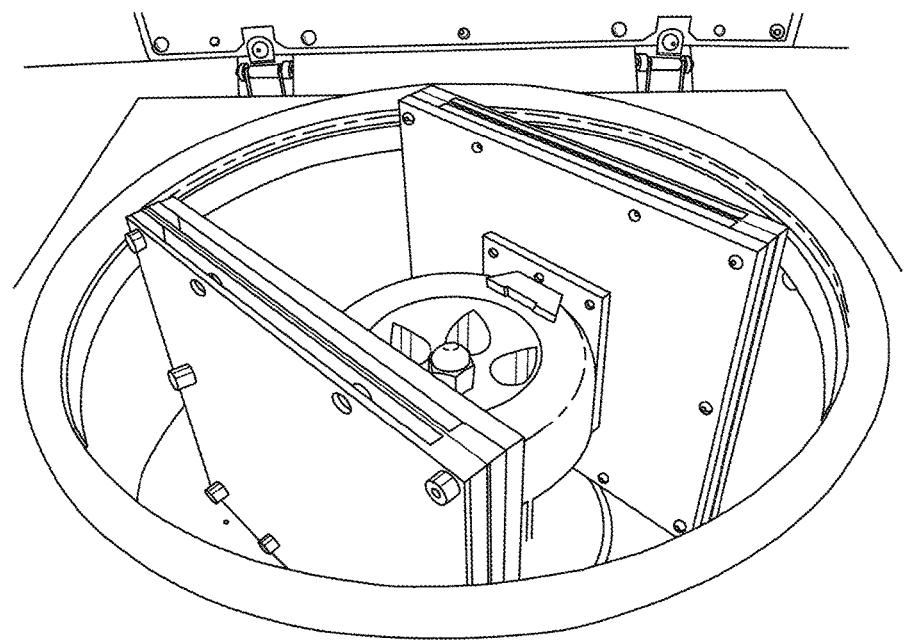
FIG. 4 is a picture of a Wafer Level Centrifuge (WLC) system according to an embodiment of the present invention.

FIG. 4 is a picture of a Wafer Level Centrifuge (WLC) system according to an embodiment of the present invention. Here, two wafer holding cassettes are configured in a vertical manner on a central dovetail hub coupled to a base centrifuge. The hub and cassettes can be precision balanced at fabrication.

In a specific embodiment, the wafers are loaded with the top (bond pad side) facing the dove tail mounting bracket. This will orient the g-force in the +Z direction with regard to the MEMS devices on the wafers. Each side of the WLC system needs to be matched with the same number of wafers to ensure proper balancing. Failure to balance the components properly can be a safety hazard. The spinning wafers should involve either 2 or 4 wafers, or an even number of wafers to ensure balance.

Figure 5:
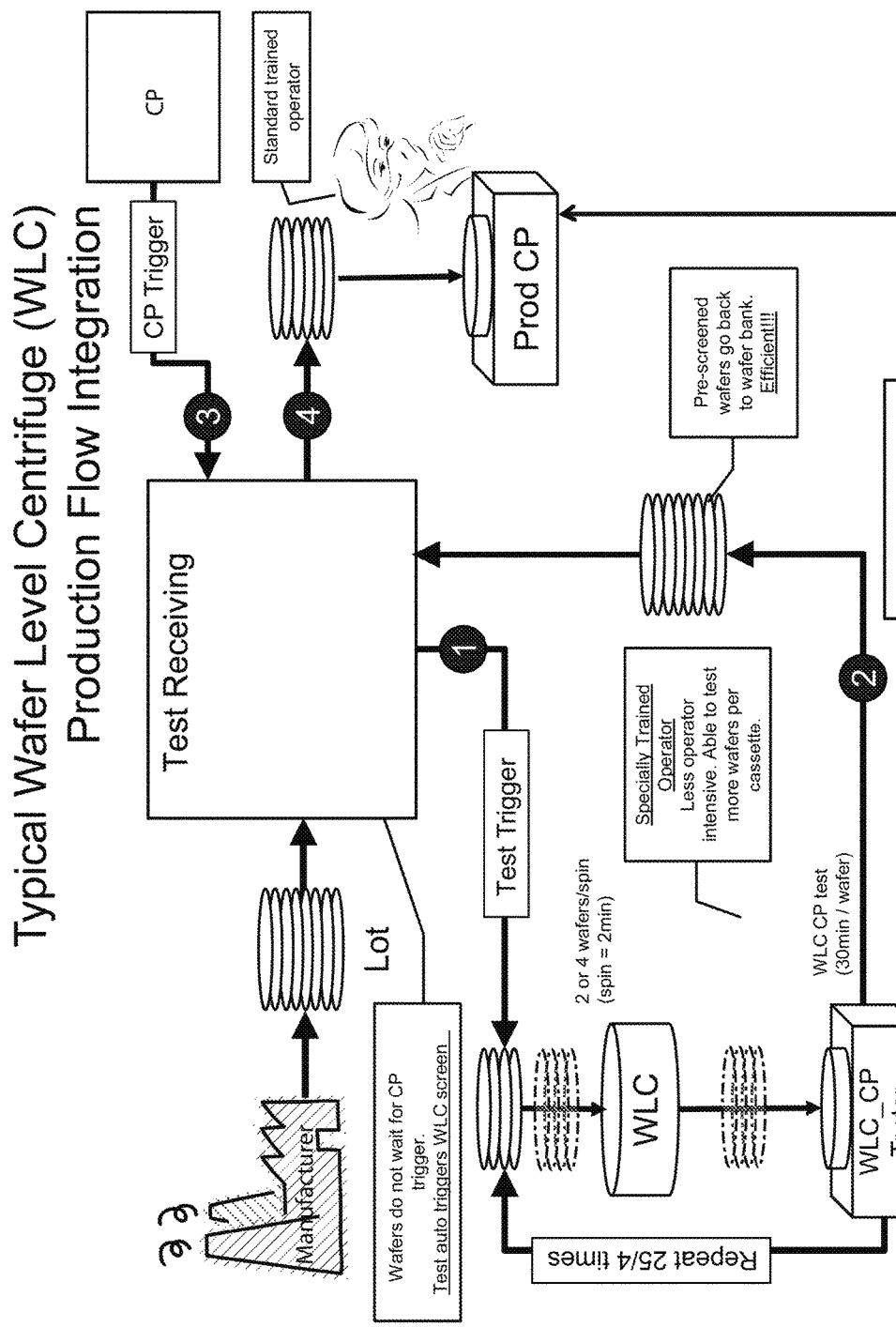
FIG. 5 is a simplified diagram illustrating a method of fabricating a MEMS device using WLC testing according to an embodiment of the present invention.

FIG. 5 is a simplified diagram illustrating a method of fabricating a MEMS device using WLC testing according to an embodiment of the present invention. This diagram shows a manufacturer providing a lot of wafers, which can be MEMS wafers having one or more MEMS devices formed thereon, to a test receiving plant. A test trigger can initiate the WLC testing process, which is independent of the CP trigger. The wafers that pass the WLC testing/screening process are then developed into a fully packaged product.

Embodiments of the methodology may include some or all of the steps:

Inserting one or more wafers into one or more wafer holding cassettes. The wafer holding cassettes may be preinstalled into the centrifuge or installed after the wafers are inserted therein.

Applying a controlled (programmed profile, e.g. smooth, continuous, step, pulsed, etc.) acceleration profile to silicon wafers.

Removing the one or more wafers from the cassettes (before or after the cassettes are removed from the centrifuge).

Integrating this stimulus method into a wafer probe production flow, e.g. determining which MEMS devices at the wafer level have/do not have stiction problems, and separating MEMS devices from the wafer that do not have stiction issues.

Embodiments of the present invention can include a wafer level centrifuge (WLC) system and method of testing MEMS devices using the system. The wafer level centrifuge (WLC) system can include a base centrifuge system and a cassette mounting hub coupled to the base centrifuge system. The method can include applying a controlled acceleration profile (e.g. static and/or smooth and continuous acceleration profile, a piece-wise linear profile, or the like) to one or more MEMS wafers via the base centrifuge system. Each of the one or more MEMS wafers can have one or more MEMS devices formed thereon. The two or more MEMS wafers can be provided in two or more wafer holding cassettes configured on the cassette mounting hub. The method can also include identifying one or more target MEMS wafers, which can include identifying stiction in one or more MEMS devices on the one or more MEMS wafers via wafer probe or other electrical test configurations.

Other embodiments of the present invention include a tray level centrifuge (TLC) system and method of testing MEMS devices using the system. The tray level centrifuge (TLC) system can also include a base centrifuge system and a cassette mounting hub coupled to the base centrifuge system. The method can include applying a smooth and continuous acceleration profile to two or more MEMS components via the base centrifuge system. These components can include trays of diced, packaged, or processed parts and the like, which are configured in tray cassettes or tray carriers and the like. These tray cassettes or carriers can be configured on the cassette mounting hub. The method can also include identifying one or more target MEMS components or parts, which can include identifying stiction in one or more of these MEMS diced or processed parts.

Figure 6:
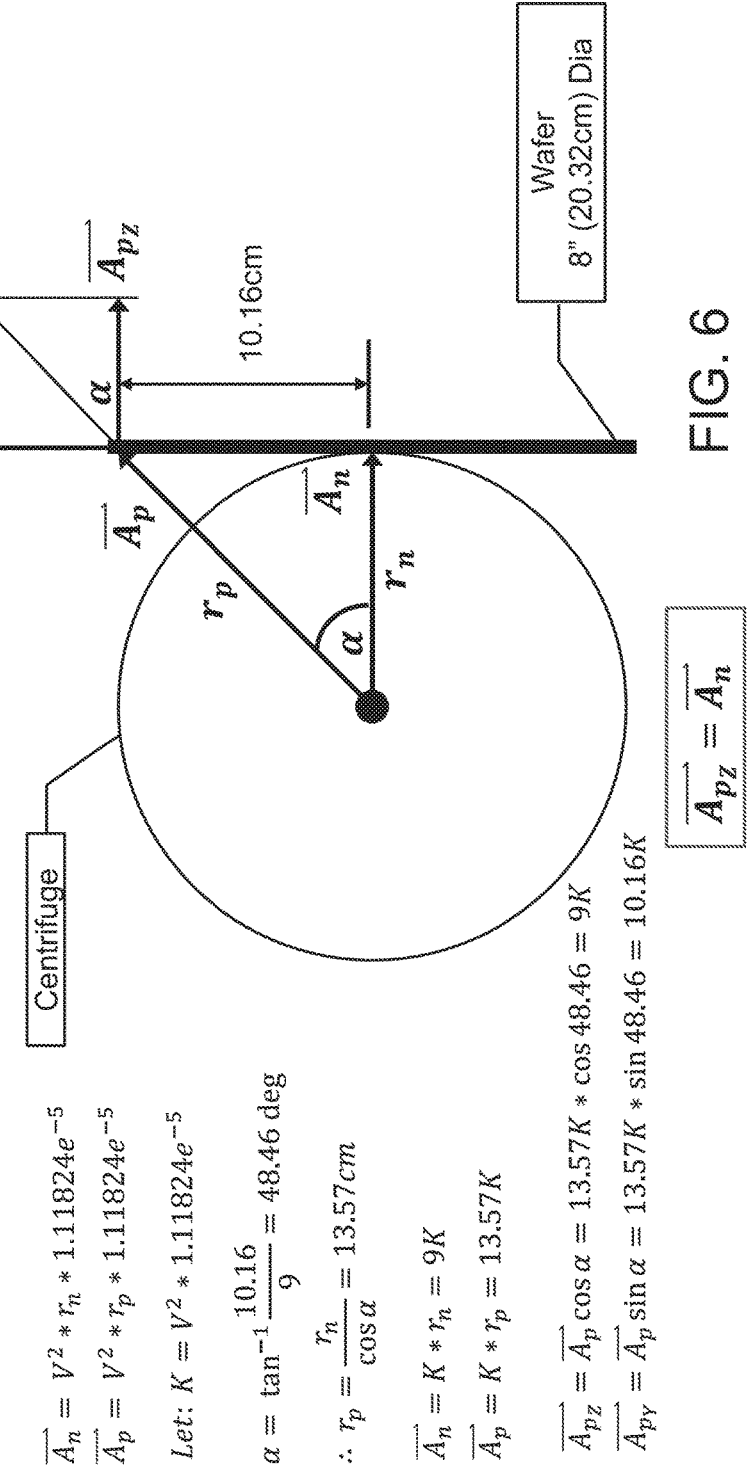
FIG. 6 is simplified diagram illustrating the forces acting on a wafer within a centrifuge according to an embodiment of the present invention.

FIG. 6 is simplified diagram illustrating the forces acting on a wafer within a centrifuge according to an embodiment of the present invention. These equations show that the force vectors $A_{pz}$ and $A_n$ are equal.

There is no difference in the Z g-force vector between a die in the center of the wafer and a die at the edge.

$$\overrightarrow{A_{pz}} = \overrightarrow{A_n}$$

However, there is a big difference in the Y g-forces. At wafer center, there is zero tangential force. At wafer edge, tangential force is 10.16K, which is 13% higher g-force that in the Z direction.

$$\overrightarrow{A_{pz}} = \overrightarrow{A_p} \cos \alpha = 13.57K \ast \cos 48.46 = 9K$$

$$\overrightarrow{A_{pY}} = \overrightarrow{A_p} \sin \alpha = 13.57K \ast \sin 48.46 = 10.16K$$

The general equation for angular velocity given a desired g-force:

$$V = \sqrt{\frac{\overrightarrow{A_n}}{9 \ast 1.11824e^{-5}}}$$

Figure 7:
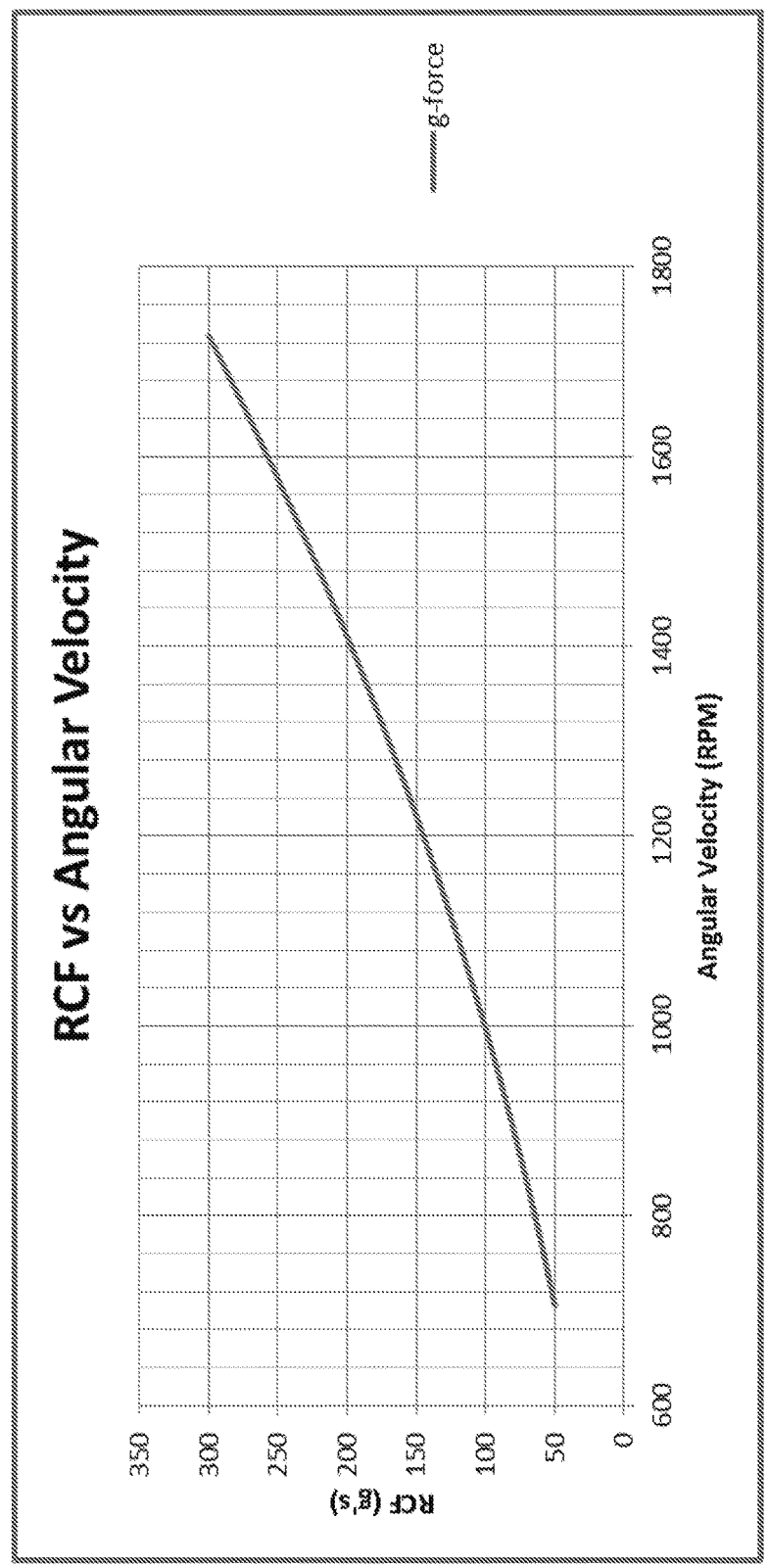
FIG. 7 is a simplified graph representing a rotational centrifugal force (RCF)—angular velocity relationship according to an embodiment of the present invention.

FIG. 7 is a simplified graph representing a rotational centrifugal force (RCF)—angular velocity relationship according to an embodiment of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for testing MEMS devices using a centrifuge screening system comprising a base centrifuge system and a cassette mounting hub coupled to the base centrifuge system, the method comprising:
   inserting one or more MEMS components into each of two or more cassettes;
   coupling the two or more cassettes to the cassette mounting hub;
   applying a controlled acceleration profile to the one or more MEMS components of each cassette via the base centrifuge system, wherein each of the one or more MEMS components of each cassette having one or more MEMS devices formed thereon;
   remove the one or more MEMS components of each cassette from the two or more cassettes; and
   determining one or more MEMS devices from the one or more MEMS components having physical problems;
   wherein the coupling the two or more cassettes to the cassette mounting hub is such that the g-force from applying the acceleration profile is oriented in the +Z direction relative to the one or more MEMS devices of each of the one or more MEMS components.

2. The method of claim 1 wherein the one or more MEMS components of each cassette and the two or more cassettes are configured in a precision balanced manner on the cassette mounting hub.

3. The method of claim 1 wherein the one or more MEMS components of each cassette comprise a MEMS wafer and the two or more cassettes comprise two or more wafer holding cassettes, and wherein each of the one or more MEMS wafers of each cassette comprises a top or bond pad side, and wherein the one or more MEMS wafers of each cassette and the two or more wafer holding cassettes are configured such that the top side of each of the MEMS wafers faces the cassette mounting hub from within the two or more wafer holding cassettes.

4. The method of claim 1 wherein the physical problems comprises stiction problems.

5. The method of claim 1 wherein the two or more cassettes are vertically mounted or horizontally mounted on the cassette mounting hub.

6. The method of claim 1 wherein the one or more MEMS components comprise one or more MEMS wafers, one or more MEMS diced parts, one or more processed MEMS, or one or more packaged MEMS.

7. A method for testing MEMS devices using a centrifuge screening system comprising a base centrifuge system and a cassette mounting hub coupled to the base centrifuge system, the method comprising:
   providing one or more MEMS components each having one or more MEMS devices formed thereon;
   configuring the one or more MEMS components within two or more cassettes;
   configuring the two or more cassettes on the cassette mounting hub;
   applying a controlled acceleration profile to the MEMS components via the base centrifuge system; and
   identifying one or more target MEMS components that have physical problems as a result of testing;
   wherein the configuring of the one or more MEMS components and the two or more cassettes is such that the g-force from applying the acceleration profile is oriented in the +Z direction relative to the one or more MEMS devices of each of the one or more MEMS components.

8. The method of claim 7 wherein the configuring of the one or more MEMS components and the two or more cassettes are configured in a precision balanced manner on the cassette mounting hub.

9. The method of claim 7 wherein the one or more MEMS components comprise two or more MEMS wafers and the two or more cassettes comprise two or more wafer holding cassettes, and wherein each of the two or more MEMS wafers comprises a top or bond pad side, and wherein the configuring of the two or more MEMS wafers and the two or more wafer holding cassettes are such that the top side of each of the MEMS wafers faces the cassette mounting hub from within the two or more wafer holding cassettes.

10. The method of claim 7 wherein the identifying of the one or more target MEMS components comprises identifying stiction in one or more MEMS devices on the one or more MEMS components.

11. The method of claim 7 wherein the identifying of the one or more target MEMS components comprises a chip probing process, a wafer probing process, or convention wafer probe production process.

12. The method of claim 7 wherein providing the one or more MEMS components comprises providing two or four MEMS wafers, each of the two or four MEMS wafers having one or more MEMS devices formed thereon.

13. The method of claim 7 wherein each of the two or more cassettes comprise 2-slot Titanium wafer cassettes with Delrin ribs.

14. The method of claim 7 wherein the two or more cassettes are vertically mounted or horizontally mounted on the cassette mounting hub.

15. The method of claim 7 wherein the one or more MEMS components comprise one or more MEMS wafers, one or more MEMS diced parts, one or more processed MEMS, or one or more packaged MEMS.

16. The method of claim 7 wherein the cassette mounting hub comprises a pinned dovetail central cassette mounting hub.

17. The method of claim 7 wherein the controlled acceleration profile includes a smooth acceleration profile, a static acceleration profile, a continuous acceleration profile, a step-wise acceleration profile, or a pulsed acceleration profile.

18. The method of claim 7 wherein the two or more cassettes comprise two or more tray cassettes or tray carriers, and wherein configuring the one or more MEMS components within the two or more cassettes comprises configuring MEMS diced parts, MEMS packaged parts, or MEMS processed parts within each of the two or more tray cassettes or tray carriers.

\* \* \* \* \*